(12) United States Patent
Chang et al.

(10) Patent No.: US 10,896,698 B2
(45) Date of Patent: Jan. 19, 2021

(54) MAIN BOARD AND COMPUTER APPARATUS WITH CONNECTORS OF BOTH DUAL IN-LINE PACKAGE AND SURFACE MOUNT TECHNOLOGY

(71) Applicant: Wistron Corporation, New Taipei (TW)

(72) Inventors: Yao-Chung Chang, New Taipei (TW); Wen-Jui Hsu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/008,038

(22) Filed: Jun. 14, 2018

(65) Prior Publication Data

US 2019/0304513 A1   Oct. 3, 2019

(30) Foreign Application Priority Data

Mar. 28, 2018   (TW) .............................. 107203996 U

(51) Int. Cl.
  *G11C 5/04*   (2006.01)
  *G11C 7/10*   (2006.01)
  *H05K 1/18*   (2006.01)
(52) U.S. Cl.
  CPC .................. *G11C 5/04* (2013.01); *G11C 7/10* (2013.01); *H05K 1/18* (2013.01); *G11C 2207/10* (2013.01)

(58) Field of Classification Search
  CPC .......... G11C 5/04; G11C 7/10; G11C 2207/10; H05K 1/18
  See application file for complete search history.

(56) References Cited

U.S. PATENT DOCUMENTS

| 6,048,214 | A  | * | 4/2000 | Hirata | ................. | H01R 12/716 |
| | | | | | | 439/101 |
| 8,438,515 | B2 | * | 5/2013 | Leddige | .................. | G11C 5/02 |
| | | | | | | 716/110 |
| 9,907,187 | B1 | * | 2/2018 | Tseng | ...................... | H05K 1/117 |
| 2010/0003843 | A1 | * | 1/2010 | Yeh | ......................... | H05K 1/182 |
| | | | | | | 439/264 |
| 2010/0112830 | A1 | * | 5/2010 | Hirashima | ........... | H01R 12/716 |
| | | | | | | 439/74 |
| 2016/0179733 | A1 | * | 6/2016 | Huang | ................. | G06F 13/4072 |
| | | | | | | 710/308 |
| 2017/0069988 | A1 | * | 3/2017 | Ouyang | .................. | H01R 13/71 |
| 2019/0027443 | A1 | * | 1/2019 | Murtuza | ................. | H01L 23/552 |

* cited by examiner

*Primary Examiner* — Sultana Begum
(74) *Attorney, Agent, or Firm* — JCIPRNET

(57) ABSTRACT

A main board and a computer apparatus having the main board are provided. The main board includes a printed circuit board (PCB), a first connector, and a second connector. The PCB is configured for being electrically connected to a processor. The first connector is electrically connected to the PCB in a dual in-line package (DIP) manner, and is configured for a memory to be mounted to the first connector. The second connector is electrically connected to the PCB in a surface mount technology (SMT) manner, and is configured for the memory to be mounted to the second connector. Accordingly, transmission performance of memory signals may be improved.

20 Claims, 7 Drawing Sheets

US 10,896,698 B2

MAIN BOARD AND COMPUTER APPARATUS WITH CONNECTORS OF BOTH DUAL IN-LINE PACKAGE AND SURFACE MOUNT TECHNOLOGY

CROSS-REFERENCE TO RELATED APPLICATION

This application claims the priority benefit of Taiwan application serial no. 107203996, filed on Mar. 28, 2018. The entirety of the above-mentioned patent application is hereby incorporated by reference herein and made a part of this specification.

TECHNICAL FIELD

The disclosure relates to a main board; more particularly, the disclosure relates to a main board and a computer apparatus capable of improving transmission performance of a memory.

DESCRIPTION OF RELATED ART

A random access memory (RAM) is an important hardware component used by a computer apparatus (e.g., a desktop computer, a notebook computer, a server, etc.) for temporarily storing data. FIG. 1 is a schematic view of a structure of a conventional computer apparatus. With reference to FIG. 1, a main board of the computer apparatus has multiple layers of printed circuit boards (PCBs) having three vertical interconnect accesses (vias) passing through multiple layers of circuit substrates, so that circuit traces of different layers of PCBs can communicate. The three vias are electrically connected to a central processing unit (CPU) and two dual in-line package (DIP) connectors, respectively. The DIP connectors are through-hole mounted to the PCBs and are then soldered and serve as a bridge between memories 0 and 1 and the main board. Thereby, signals from the CPU may be transmitted to the memories 0 and 1 through two vias and the DIP connectors.

With the advancement of science and technology, hardware requirements of applications including cloud computation, hyper-converged infrastructure (HCI), and virtual reality (VR) are increasing, among which the requirement for memory transmission speed may also increase. Although the conventional structure depicted in FIG. 1 may satisfy the current requirement for mainstream transmission rate (less than 2933 transmission times per second (MT/s)), if the mainstream transmission rate reaches 3200 MT/s in the future, excessive crosstalk derived from parasitic capacitance effect may pose an impact on the vias connected to the two DIP connectors, which greatly affects the signal transmission quality and makes the signal unable to be correctly interpreted by the CPU and the memories.

SUMMARY

In view of the above, the disclosure provides a main board and a computer apparatus in which a DIP connector and a surface mount technology (SMP) connector are applied to reduce at least one via hole, thereby improving signal transmission performance of a memory.

In an embodiment, a main board including a PCB, a first connector, and a second connector is provided. The PCB is used for being electrically connected to a processor. The first connector is electrically connected to the PCB in a DIP manner, and is configured for a memory to be mounted to the first connector. The second connector is electrically connected to the PCB in a SMT manner and configured for the memory to be mounted to the second connector.

According to an embodiment, the first connector is configured for being electrically connected to the processor, and the second connector is electrically connected to the first connector.

According to an embodiment, the PCB includes multiple layers of circuit substrates. The main board further includes a first via and a second via. The first via is configured for being electrically connected to the processor. The second via is electrically connected to the first connector. Here, a signal transmission layer in the circuit substrates includes a circuit trace electrically connected to the first via and the second via.

According to an embodiment, the signal transmission layer is located between a surface layer and a bottom layer of the layers of circuit substrates.

According to an embodiment, a length of the first via and the second via is approximately a distance from the surface layer to the signal transmission layer.

According to an embodiment, the signal transmission layer is the bottom layer of the circuit substrates.

According to an embodiment, a length of the first via and the second via is approximately a distance from the surface layer to the bottom layer.

According to an embodiment, the second connector is configured for being electrically connected to the processor, and the first connector is electrically connected to the second connector.

According to an embodiment, the PCB includes at least one layer of circuit substrate. The circuit substrate include a surface layer, and the surface layer includes a circuit trace electrically connected to the first connector and the second connector and is configured for being electrically connected to the processor.

According to an embodiment, the memory is a dual in-line memory module (DIMM).

In an embodiment, a computer apparatus including a main board, a processor, and at least one memory is provided. The main board includes a PCB, a first connector, and a second connector. The first connector is electrically connected to the PCB in a DIP manner. The second connector is electrically connected to the PCB in a SMT manner. The processor is electrically connected to the PCB. The at least one memory is mounted to at least one of the first connector and the second connector.

According to an embodiment, the first connector is electrically connected to the processor, and the second connector is electrically connected to the first connector.

According to an embodiment, the PCB includes multiple layers of circuit substrates. The main board further includes a first via and a second via. The first via is electrically connected to the processor. The second via is electrically connected to the first connector. Here, a signal transmission layer in the layers of circuit substrates includes a circuit trace electrically connected to the first via and the second via.

According to an embodiment, the signal transmission layer is located between a surface layer and a bottom layer of the circuit substrates.

According to an embodiment, a length of the first via and the second via is approximately a distance from the surface layer to the signal transmission layer.

According to an embodiment, the signal transmission layer is the bottom layer of the circuit substrates.

According to an embodiment, a length of the first via and the second via is approximately a distance from the surface layer to the bottom layer.

According to an embodiment, the second connector is electrically connected to the processor, and the first connector is electrically connected to the second connector.

According to an embodiment, the PCB includes at least one layer of circuit substrate. The circuit substrate include a surface layer, and the surface layer includes a circuit trace electrically connected to the processor, the first connector, and the second connector.

According to an embodiment, the at least one memory is a DIMM.

In light of the foregoing, according to an embodiment, a hybrid connector configuration (i.e., DIP and SMT connectors) is provided, and the via is merely arranged on the DIP connector but not the SMT connector, thereby solving the crosstalk issue to some extent. Given that one via is provided, the overall performance provided in an embodiment here is greater than that achieved by the conventional dual DIP connectors. Moreover, even if the via is removed, the performance provided in an embodiment here is also satisfactory.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DETAILED DESCRIPTION OF EMBODIMENTS

Figure 2:
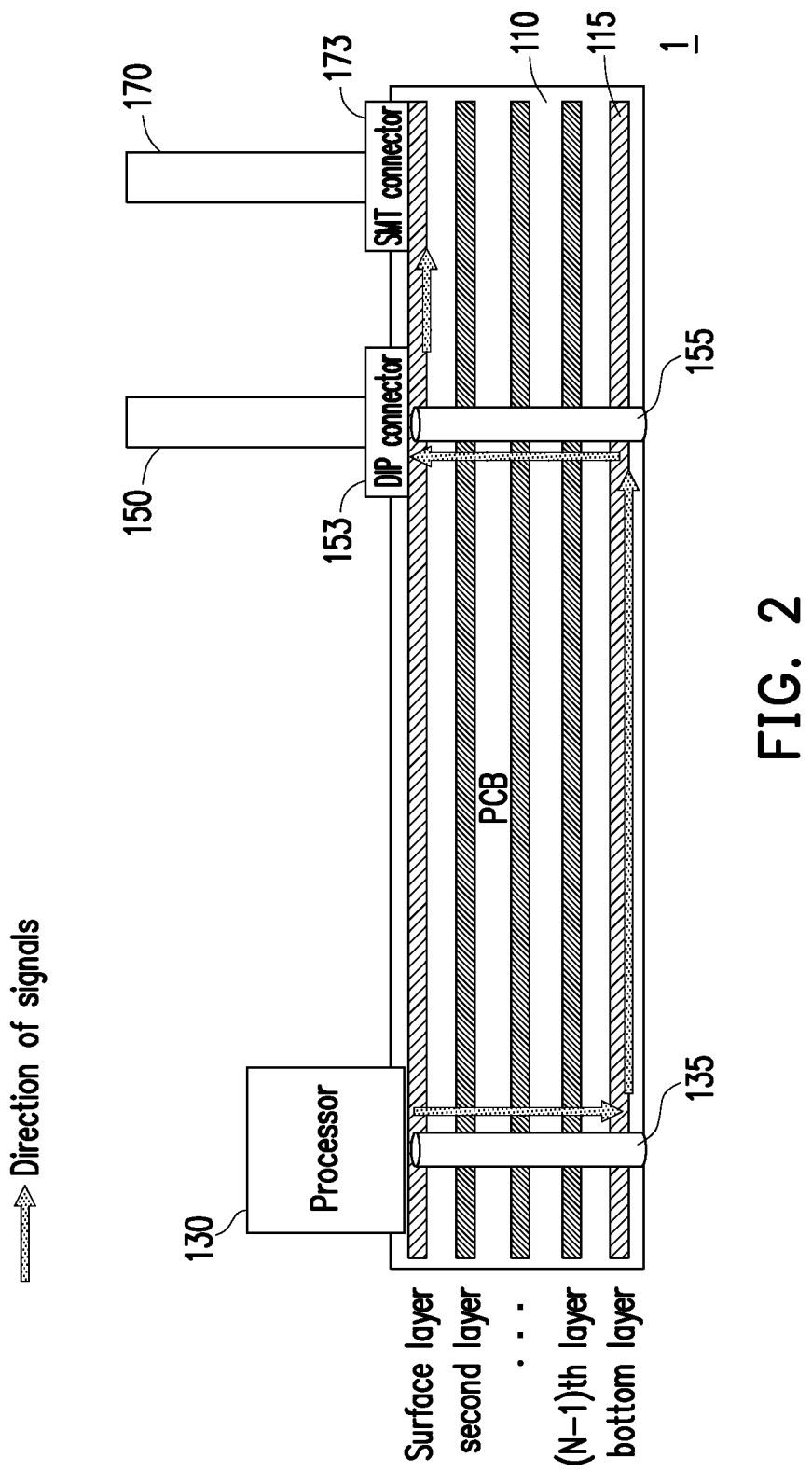
FIG. 2 is a schematic view of a main board according to a first embodiment of the disclosure.

FIG. 2 is a schematic view of a main board 1 according to a first embodiment of the disclosure. With reference to FIG. 2, the main board 1 includes but is not limited to a PCB 110, two vias 135 and 155, a DIP connector 153, and a SMT connector 173.

The PCB 110 includes multiple layers of circuit substrates, i.e., N layers including the surface layer, the second layer, . . . , the $(N-1)^{th}$ layer, and the bottom layer as shown in the drawings, wherein N is a positive integer greater than 1. The circuit substrates have circuit traces (also referred to as circuits) made of copper or other conductive substance to electrically conduct the soldered electronic components (e.g., resistors, capacitors, inductors, or different types of chips), and the PCB 110 is configured for being electrically connected to the processor 130, the DIP connector 153, and the SMT connector 173.

The vias 135 and 155 are formed on the PCB 110 (the PCB 110 must first be drilled, and the drilled holes are coated with conductive substance to form the vias 135 and 155) for being electrically connected to the processor 130 and the DIP connector 153. Here, the processor 130 is, for instance, a CPU, a microprocessor of general or special purposes, a digital signal processor (DSP), a programmable controller, an application-specific integrated circuit (ASIC), another similar device, or a combination thereof, and the PCB 110 is equipped with a processor socket. The vias 135 and 155 also serve to communicate the circuit traces on different layers of circuit substrates; that is, signals may be transmitted in different layers through the vias 135 and 155. Note that the vias 135 and 155 are electrically connected to the circuit traces on a signal transmission layer 115 (i.e., the bottom layer) in the circuit substrates, such that the processor 130 and the first connector 153 are conducted (or electrically connected). In the present embodiment, the vias 135 and 155 extend from the surface layer to the bottom layer of the circuit substrates; in other words, the length of the vias 135 and 155 is approximately the distance from the surface layer to the bottom layer.

The DIP connector 153 is inserted into the PCB 110 in a DIP manner and electrically connected to the PCB 110. The DIP connector 153 may be an un-buffered dual in-line memory module (UDIMM), a registered dual in-line memory module (RDIMM), a small outline dual in-line memory module (SO-DIMM), a micro dual in-line memory module (Micro DIMM), a mini dual in-line memory module (Mini DIMM), or another connector satisfying the DIMM standard, so that the memory 150 (i.e., the DIMM compatible with the standard of the DIP connector 153) may be connected to the DIP connector 153. In the present embodiment, the DIP connector 153 may be electrically connected to the processor 130 through the circuit trace on the PCB 110 and the vias 135 and 155.

The SMT connector 173 is electrically connected to the PCB 110 in a SMT manner; that is, the electronic components are adhered to the PCB 110 and soldered by a reflow soldering oven. The SMT connector 173 may be a connector complying with various DIMM standards including UDIMM, RDIMM, SO-DIMM, Micro DIMM, or Mini DIMM, so that the memory 170 (i.e., the DIMM compatible with the standard of the SMT connector 173) may be connected to the SMT connector 173. In the present embodiment, the SMT connector 173 is electrically connected to the DIP connector 153 through the circuit trace on the surface layer of circuit substrate.

Figure 1:
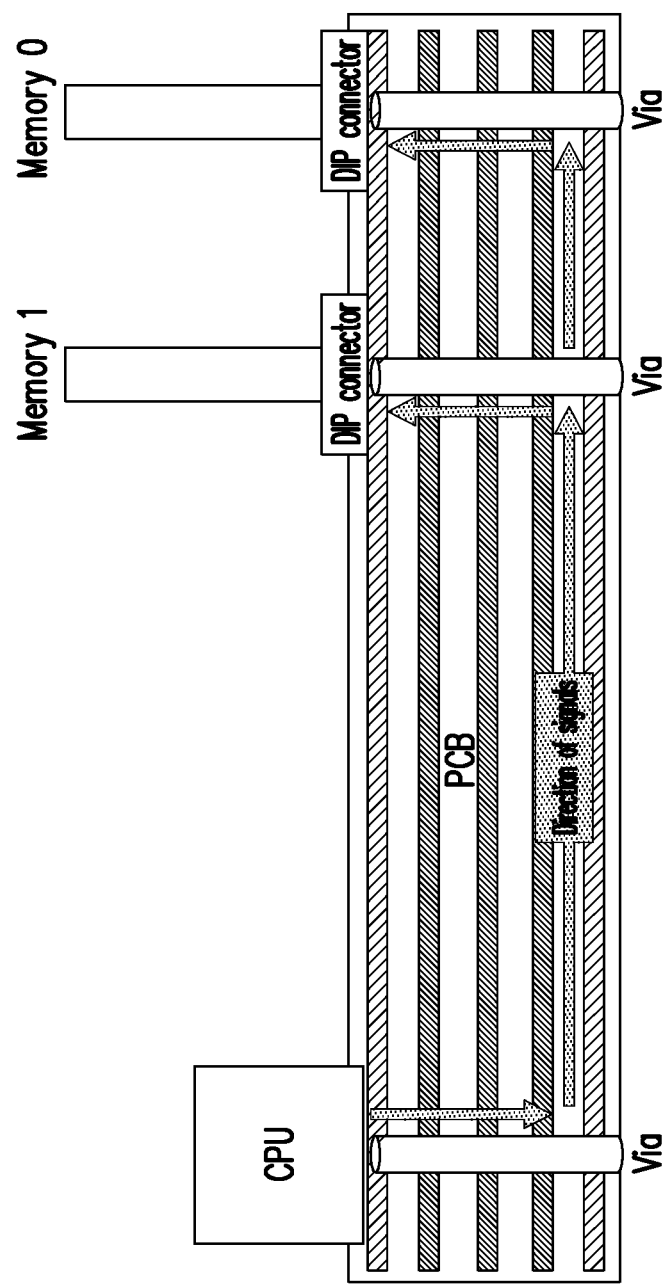
FIG. 1 is a schematic view of a structure of a conventional computer apparatus.

From the above, it may be learned that the DIP connector 153 and the SMT connector 173 in form of hybrid connector configuration are applied in an embodiment of the disclosure; namely, the DIP connector where the memory 0 is inserted in the conventional structure depicted in FIG. 1 is replaced by the SMT connector 173. According to the present embodiment, signals are transmitted to the SMT connector 173 sequentially through the processor 130, the via 135, the circuit trace on the bottom layer of circuit substrate, the via 155, the DIP connector 153, and the circuit trace on the surface layer of circuit substrate. Since it is not required to arrange any via for the SMT connector 173, the number of vias may be reduced by one according to the present embodiment in comparison with the number of vias provided in the conventional structure, and thereby the crosstalk issue may be solved to some extent.

Note that the length of the vias 135 and 155 approximately extends from the surface layer to the bottom layer in the PCB 110 according to the first embodiment; however, the length of the vias 135 and 155 is adjustable and will be further explained in another two embodiments provided below.

Figure 3:
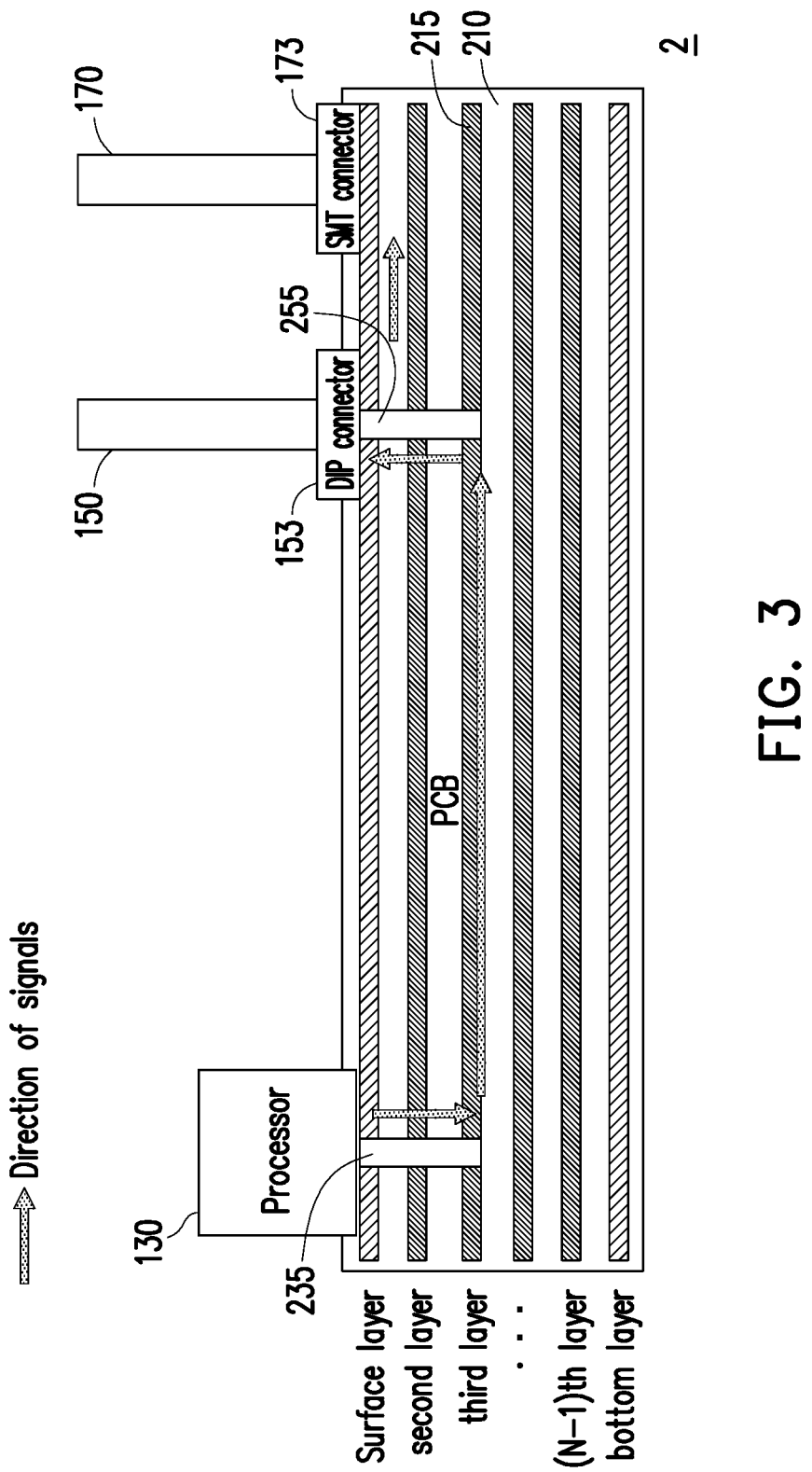
FIG. 3 is a schematic view of a main board according to a second embodiment of the disclosure.

FIG. 3 is a schematic view of a main board 2 according to a second embodiment of the disclosure. With reference to FIG. 3, the main board 2 includes but is not limited to a PCB 210, two vias 235 and 255, a DIP connector 153, and a SMT connector 173.

Different from the first embodiment, the second embodiment discloses that the signal transmission layer 215 of the PCB 210 for signal transmission related to the memory is located at the third layer (i.e., located between the surface layer and the bottom layer), and the length of the vias 235 and 255 is approximately the distance from the surface layer to the third layer (i.e., shorter than the length of the vias 135 and 155).

Figure 4:
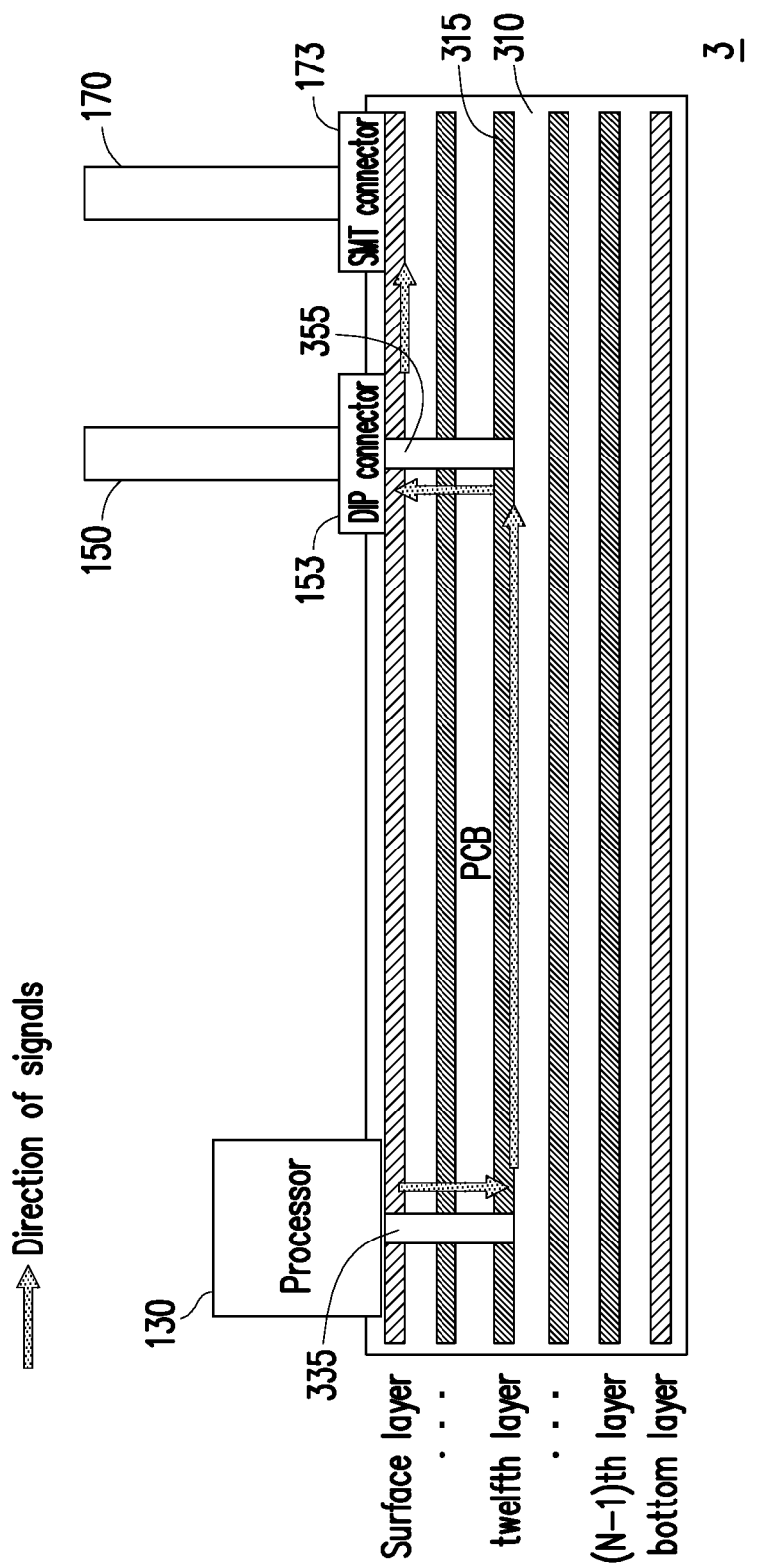
FIG. 4 is a schematic view of a main board according to a third embodiment of the disclosure.

FIG. 4 is a schematic view of a main board 3 according to a third embodiment of the disclosure. With reference to FIG. 4, the main board 3 includes but is not limited to a PCB 310, two vias 335 and 355, a DIP connector 153, and a SMT connector 173.

Different from the first embodiment, the third embodiment discloses that the signal transmission layer 315 of the PCB 310 for signal transmission related to the memory is located at the twelfth layer (i.e., located between the surface layer and the bottom layer), and the length of the vias 335 and 355 is approximately the distance from the surface layer to the twelfth layer (i.e., shorter than the length of the vias 135 and 155).

Note that the number of layers of circuit substrates in the first, second and third embodiments may be adjusted according to the actual of the user (in consideration of the size of the circuit substrates and whether the length of the circuit trace is sufficient); that is, the signals may be transmitted to the memory through any layer of multi-layer PCB, and the length of the vias in the PCB may be accordingly adjusted, which should not be construed as a limitation in the embodiment of the disclosure.

The first, second, and third embodiments disclose the arrangement of the vias, while the DIP connector may not be equipped with the via connected thereto in other embodiments.

Figure 5:
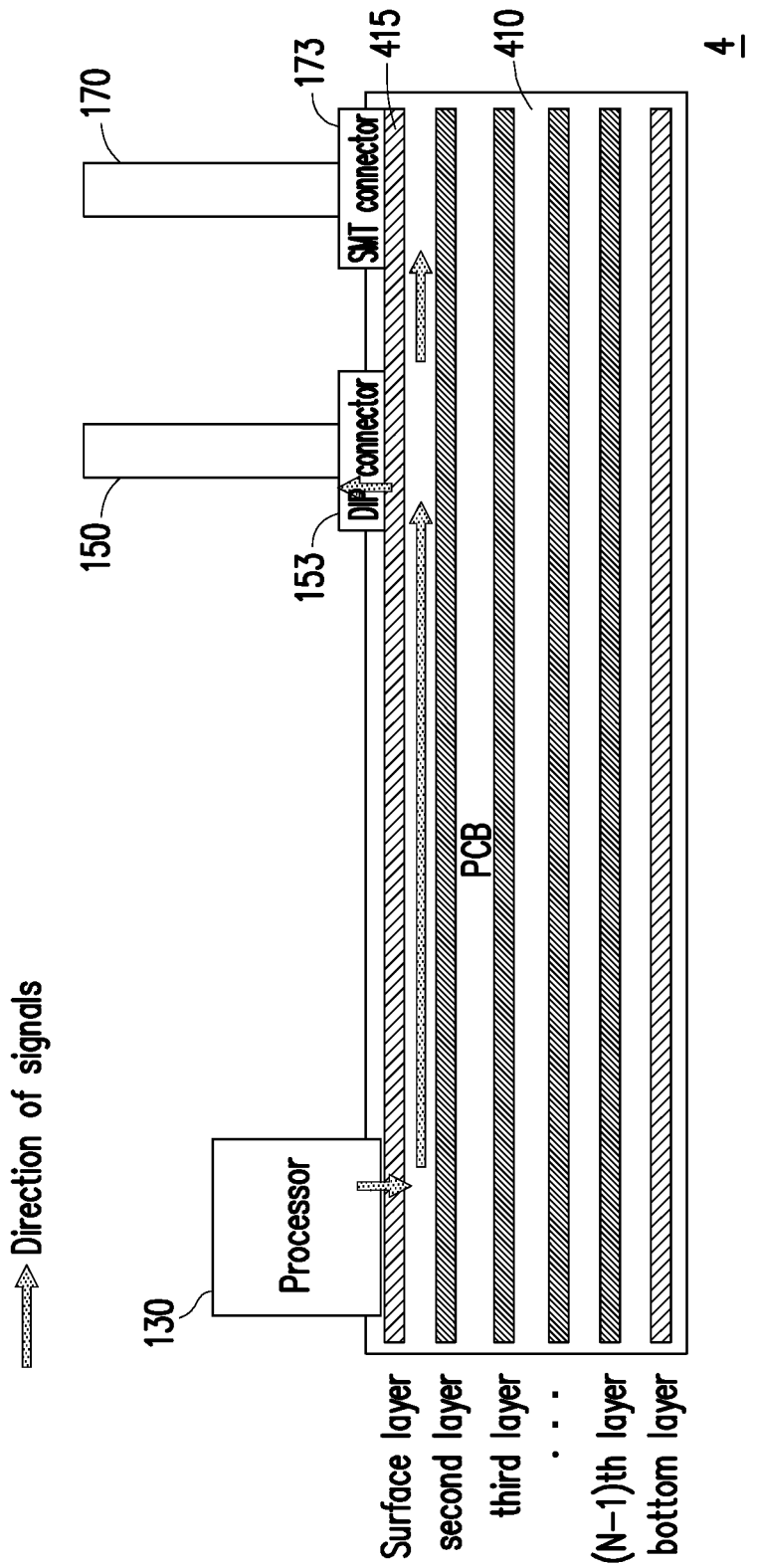
FIG. 5 is a schematic view of a main board according to a fourth embodiment of the disclosure.

FIG. 5 is a schematic view of a main board 4 according to a fourth embodiment of the disclosure. With reference to FIG. 5, the main board 4 includes but is not limited to a PCB 410, a DIP connector 153, and a SMT connector 173.

Different from the first, second, and third embodiments, the fourth embodiment discloses that the PCB 410 is not equipped with any via connected to the processor 130 and the DIP connector 153, and the surface layer of the layers of circuit substrates in the PCB 410 has a circuit trace connected to the processor 130, the DIP connector 153, and the SMT connector 173, so that the signals are sequentially transmitted to the SMT connector 173 sequentially through the processor 130, the circuit trace on the surface layer of the circuit substrates, the DIP connector 153, and the circuit trace on the surface layer (i.e., the signal transmission layer is located at the surface layer).

Note that the number of layers of circuit substrates may vary in other embodiments, as long as the number of layers is an integer greater than 0. Besides, the locations of the DIP connector 153 and the SMT connector 173 disposed on the PCB 410 may be changed; for instance, the locations of the DIP connector 153 and the SMT connector 173 may be exchanged, so that the SMT connector is located closer to the processor 130, and the SMT connector 173 may be connected to the processor 150 through the circuit trace on the surface layer of the circuit substrates. That is, the signals are transmitted to the DIP connector 153 sequentially through the processor 130, the circuit trace on the surface layer of the circuit substrates, the SMT connector 173, and the circuit trace on the surface layer.

Figure 6:
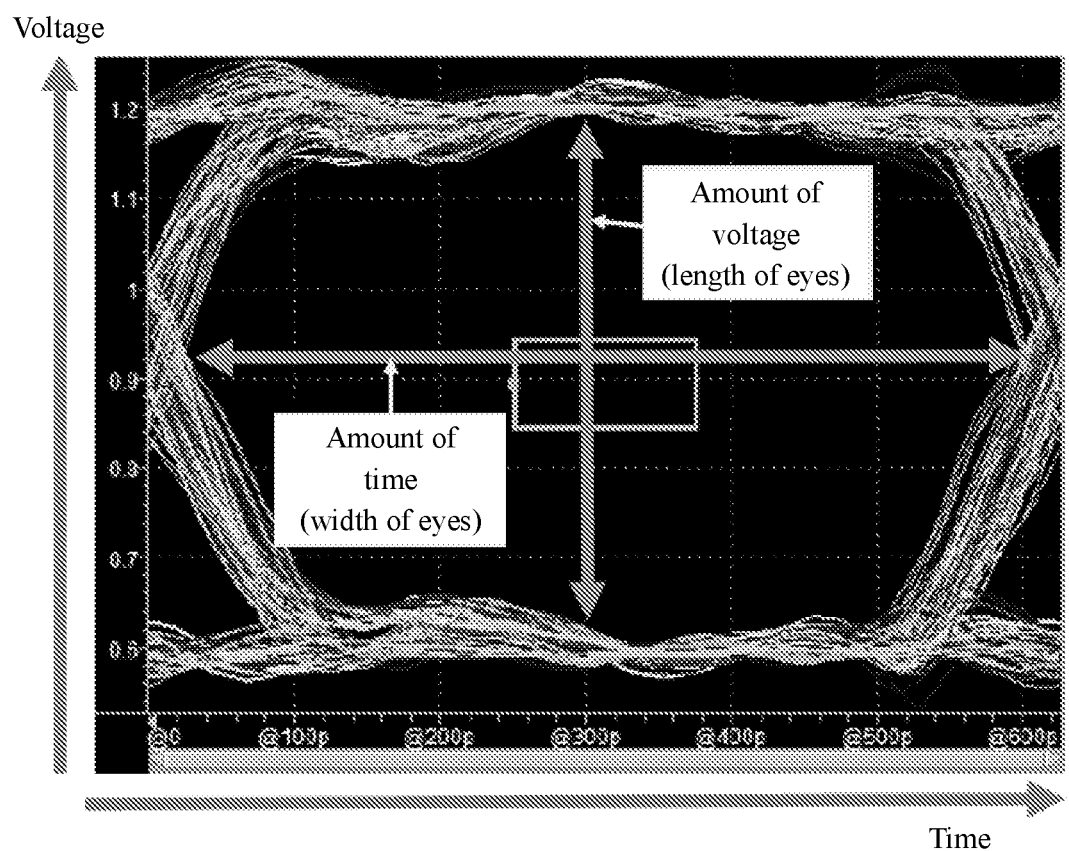
FIG. 6 is a schematic view of a height and a width of eyes.

To further verity the performance provided in the embodiments of the disclosure, comparisons are made below, given that a restriction of bit error rate (BER) is set as 1e-15. The BER as 1e-15 means that errors may merely occur in one bit among one gigabit of data. For instance, the BER is the quotient obtained by dividing the number of error bit (=1) by the number of transmitted bits (=10), and the quotient is 0.1 or 10%. With reference to FIG. 6, which is a schematic view showing the required amount of the minimum time (the width of eyes) and the required amount of the voltage (the height of eyes) on signals; the greater the length and the width of eyes, the less the impact of crosstalk and noise on the signals.

TABLE (1)

| Type of connectors | Height of eyes (mV) | Width of eyes (ps) |
|---|---|---|
| Dual DIP connectors | 0.031305 | 42.736921 |
| Hybrid (the second embodiment) | 0.08408 | 79.177358 |

TABLE (2)

| Type of connectors | Height of eyes (mV) | Width of eyes (ps) |
|---|---|---|
| Dual DIP connectors | 0.004266 | 7.361501 |
| Hybrid (the third embodiment) | 0.073088 | 75.912635 |

TABLE (3)

| Type of connectors | Height of eyes (mV) | Width of eyes (ps) |
|---|---|---|
| Dual DIP connectors | 0.018326 | 33.329794 |
| Hybrid (the fourth embodiment) | 0.09362 | 90.40005 |

The Tables (1), (2), and (3) provide the simulation results on the conditions that the signal transmission layer is located at the third layer, the twelfth layer, and the surface layer, respectively, and the BER is set as 1e-15. It can be learned from the Tables (1), (2), and (3) that the height and the width of eyes provided in the present embodiment are both greater than those in a conventional DIP connector, which indicates that the signal transmission performance provided in the embodiments of the disclosure is better. In the embodiments of the disclosure, the shorter the vias, the greater the performance. Note that the performance is optimized if no via is arranged (according to the fourth embodiment).

Figure 7:
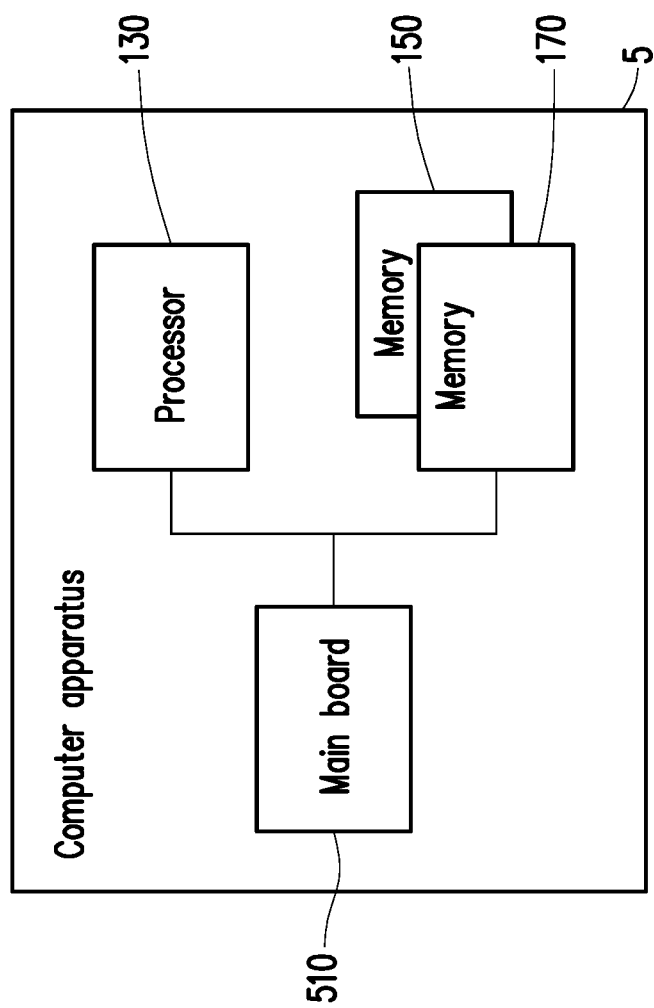
FIG. 7 is a block view of components of a computer apparatus according to an embodiment of the disclosure.

On the other hand, please refer to FIG. 7, which is a block view of components of a computer apparatus 5 according to an embodiment of the disclosure. The computer apparatus 5 may be an electronic apparatus, such as a desktop computer, a notebook computer, a server, a workstation, and so forth. The computer apparatus 5 includes but is not limited to the processor 130, memories 150 and 170, and a main board 510.

The types of the processor 130 and the memories 150 and 170 may the referred to as those provided in the first embodiment and depicted in FIG. 2, and the main board 510 may be any of the main boards 1-4 provided in the first to the fourth embodiments and depicted in FIG. 2 to FIG. 5, so that the computer apparatus 5 is also characterized by great performance of signal transmission of the memory. Note that in other embodiments it is likely to merely install one of the memories 150 and 170 onto the main board 510, which should however not be construed as a limitation in the disclosure.

To sum up, in the main board and the computer apparatus provided in an embodiment of the disclosure, the PCB is provided with a hybrid connector configuration (i.e., DIP and SMT connectors), and the via is merely arranged on the DIP connector but not the SMT connector (it is also possible not to arrange any via), thereby solving the crosstalk issue to some extent. Thereby, the overall performance provided in an embodiment here is greater than that achieved by the conventional dual DIP connectors, and the signals at the transmission speed of 3200 MT/s or higher may be correctly interpreted.

It will be apparent to those skilled in the art that various modifications and variations can be made to the structure described in the disclosure without departing from the scope or spirit of the disclosure. In view of the foregoing, it is intended that the disclosure cover modifications and variations provided they fall within the scope of the following claims and their equivalents.

What is claimed is:

1. A main board, comprising:
   a printed circuit board, electrically connected to a processor;
   a first vertical interconnect access (via), electrically connected to the processor;
   a first connector, electrically connected to the printed circuit board in a dual in-line (DIP) package manner, wherein the first connector is disposed on the first via and a first memory is mountable to the first connector using a matching DIP connector; and
   a second connector, distinct from the first connector and disposed adjacent to the first connector at a finite distance and electrically connected to the printed circuit board in a surface mount technology (SMT) manner, wherein a second memory is mountable to the second connector using a matching SMT connector,
   wherein the first connector, the second connector, the first memory, the second memory and the processor are mounted on a top planar surface of the printed circuit board.

2. The main board according to claim 1, wherein the first connector is configured for being electrically connected to the processor, and the second connector is electrically connected to the first connector.

3. The main board according to claim 1, the printed circuit board comprising:
   a plurality of layers of circuit substrates, the main board further comprising:
   a second vertical interconnect access (via), configured for being electrically connected to the processor;
   wherein the first via is electrically connected to the first connector, wherein a signal transmission layer in the circuit substrates comprises a circuit trace electrically connected to the first via and the second via.

4. The main board according to claim 3, wherein the signal transmission layer is located between a surface layer and a bottom layer of the circuit substrates.

5. The main board according to claim 4, wherein a length of the first via and the second via is approximately a distance from the surface layer to the signal transmission layer.

6. The main board according to claim 3, wherein the signal transmission layer is the bottom layer of the circuit substrates.

7. The main board according to claim 6, wherein a length of the first via and the second via is approximately a distance from the surface layer to the bottom layer.

8. The main board according to claim 1, wherein the second connector is configured for being electrically connected to the processor, and the first connector is electrically connected to the second connector.

9. The main board according to claim 1, the printed circuit board comprising:
   at least one layer of circuit substrate comprising a surface layer, wherein the surface layer comprises a circuit trace electrically connected to the first connector and the second connector and is configured for being electrically connected to the processor.

10. The main board according to claim 1, wherein the memory is a dual in-line memory module.

11. A computer apparatus, comprising:
    a first memory;
    a second memory;
    a processor;
    a main board, comprising:
      a printed circuit board;
      a first vertical interconnect access (via), electrically connected to the processor;
      a first connector, electrically connected to the printed circuit board in a dual in-line package (DIP) manner, wherein the first connector is disposed on the first via and the first memory is mountable to the first connector using a matching DIP connector; and
      a second connector, distinct from the first connector and disposed adjacent to the first connector at a finite distance electrically connected to the printed circuit board in a surface mount technology (SMT) manner, wherein the second memory is mountable to the second connector using a matching SMT connector; and
    a processor, electrically connected to the printed circuit board,
    wherein the first connector, the second connector, the first memory, the second memory and the processor are mounted on a top planar surface of the printed circuit board.

12. The computer apparatus according to claim 11, wherein the first connector is electrically connected to the processor, and the second connector is electrically connected to the first connector.

13. The computer apparatus according to claim 11, the printed circuit board comprising:
    a plurality of layers of circuit substrates, the main board further comprising:
    a second vertical interconnect access (via), electrically connected to the processor;
    wherein the first via is electrically connected to the first connector, wherein a signal transmission layer in the circuit substrates comprises a circuit trace electrically connected to the first via and the second via.

14. The computer apparatus according to claim 13, wherein the signal transmission layer is located between a surface layer and a bottom layer of the circuit substrates.

15. The computer apparatus according to claim 14, wherein a length of the first via and the second via is approximately a distance from the surface layer to the signal transmission layer.

16. The computer apparatus according to claim 13, wherein the signal transmission layer is the bottom layer of the circuit substrates.

17. The computer apparatus according to claim 16, wherein a length of the first via and the second via is approximately a distance from the surface layer to the bottom layer.

18. The computer apparatus according to claim 11, wherein the second connector is electrically connected to the processor, and the first connector is electrically connected to the second connector.

19. The computer apparatus according to claim 11, the printed circuit board comprising:
- at least one layer of circuit substrate comprising a surface layer, the surface layer comprising a circuit trace electrically connected to the processor, the first connector, and the second connector.

20. The computer apparatus according to claim 11, wherein the at least one memory is a dual in-line memory module.

* * * * *